Sept. 29, 1964 A. KUEHN III 3,151,281

SEMICONDUCTOR APPARATUS

Filed July 1, 1960

INVENTOR.
ANDREW KUEHN III
BY Osmund A. Dahle
ATTORNEY

United States Patent Office 3,151,281
Patented Sept. 29, 1964

3,151,281

SEMICONDUCTOR APPARATUS

Andrew Kuehn III, Arden Hills, Minn., assignor to Honeywell Inc., a corporation of Delaware Filed July 1, 1960, Ser. No. 40,226
3 Claims. (Cl. 317—130)

Figures 1, 1A:
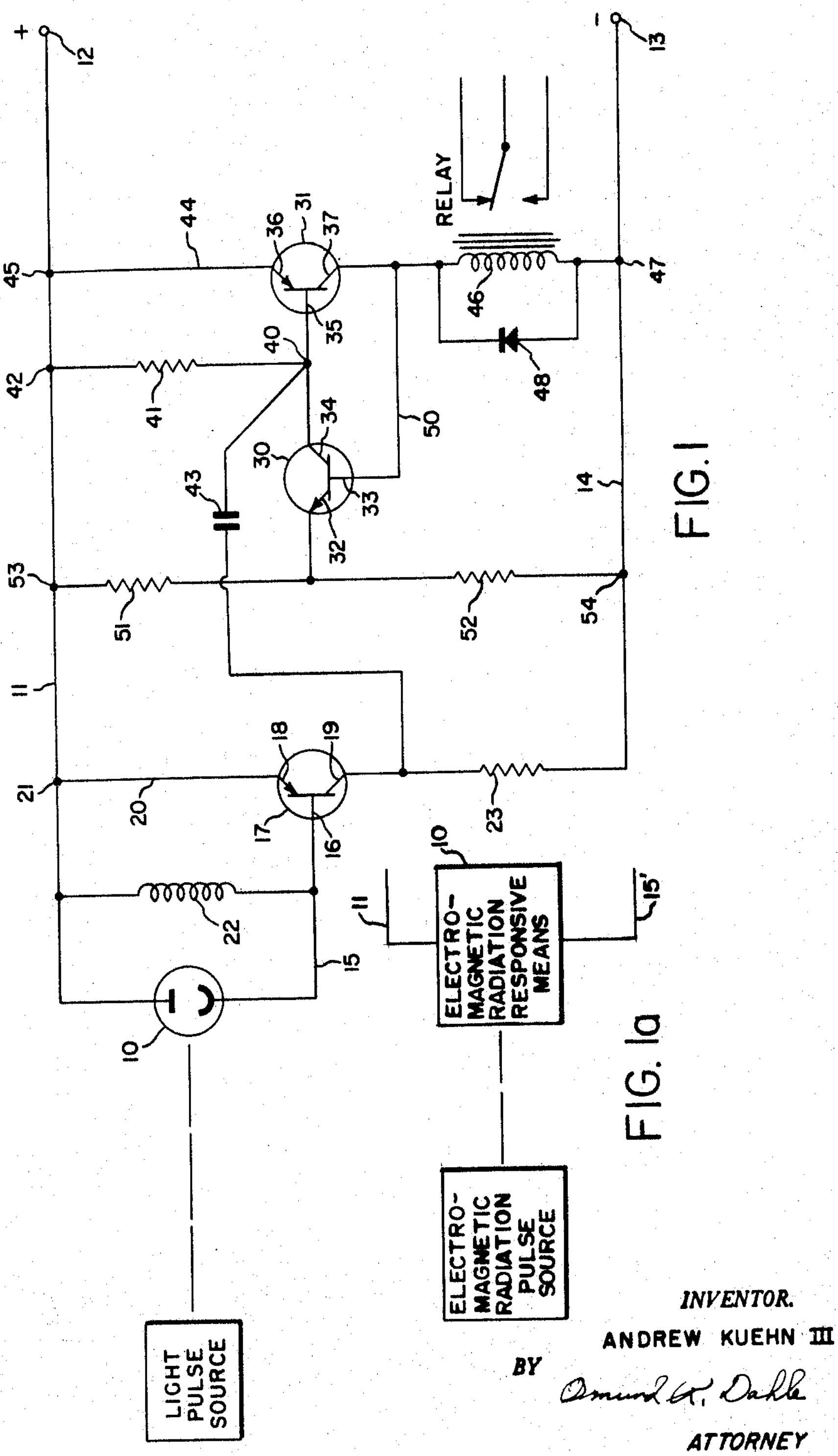

This invention relates generally to condition responsive switching apparatus, and is more particularly related to remote sensing devices using semiconductor amplifying devices for controlling load apparatus in response to remotely transmitted pulses.

In the field of control apparatus it is often desirable to operate electronic switching apparatus from off to on and vice versa from a source of pulses having a single character. For example, it may be desirable to alternately turn a controller off and on from a remote source of electromagnetic radiation pulses. It is also desirable that the controller have a very low standby current when the output is not energized.

It is therefore an object of this invention to provide a semiconductor switching apparatus controlled from a remote source of pulses and effective to alternately energize and deenergize a load controlled by said switching apparatus.

It is a further object to provide semiconductor switching apparatus controlled from a source of light pulses to energize and deenergize the switch.

This and other objects of the invention will become apparent upon further consideration of the accompanying claims, specification and drawing of which FIGURE 1 is a schematic representation of a preferred form of the circuit of the invention; and, FIGURE 1*a* is a modification of FIGURE 1.

Turning now to the drawing there is disclosed an electromagnetic radiation responsive member 10, here shown as being a light responsive member such as a photocell, preferably of the photovoltaic type. The upper terminal of the cell is directly connected to a positive power supply lead 11 which has a supply terminal 12. A direct current power source, not shown, is connected between the terminal 12 and a negative terminal 13 which has connected thereto a corresponding negative supply lead 14. The lower electrode of the cell 10 is connected by a conductor 15 to a base electrode 16 of a semiconductor amplifier 17, here shown as a junction transistor. Transistor 17 also includes an emitter electrode 18 and a collector electrode 19, the emitter electrode 18 being directly connected by a conductor 20 to a junction 21 on the positive conductor 11. A load resistor 23 is connected between the collector electrode 19 and the negative conductor 14. An inductive device 22 is directly connected across the electrodes of the photocell 10 and thereby also between the emitter and base of transistor 17.

The switching circuit controlled by photocell 10 and amplifier 17 comprises a pair of transistors 30 and 31. Transistor 30 is an NPN transistor having an emitter electrode 32, a base electrode 33 and a collector electrode 34; transistor 31 is a PNP type transistor and includes a base electrode 35, an emitter electrode 36 and a collector electrode 37. A junction 40 directly connects together collector 34 and base electrode 35. The junction 40 is also connected through a resistance 41 to a junction 42 on the conductor 11. Junction 40 is also connected by a coupling capacitor 43 to the collector electrode 19 of transistor 17. Emitter electrode 36 of transistor 31 is directly connected by a conductor 44 to a junction 45 on conductor 11 and the collector 37 is connected through a relay coil 46 to a junction 47 on the negative conductor 14. A conductor 50 directly interconnects base electrode 33 with the collector electrode 37. The emitter electrode 32 is connected to an intermediate point of a voltage divider arrangement comprising resistors 51 and 52 connected in series between conductor 11 and conductor 14, respectively. A diode 48 may be connected in parallel with relay coil 46 in order to reduce the voltage transients generated by the relay during switching. It also tends to lengthen the time required for the magnetic field to collapse in the relay.

In considering the operation of the above circuit it should be kept in mind that it is a light sensitive remote switch that responds to a light pulse and which rejects ambient or slow changing light signals. It is capable of being turned on with a given light pulse and turned off with an identical pulse when in the activated condition. Pulses of very short duration are preferred such as are provided by an electronic flash tube or the like where the flash duration is in the order of a millisecond.

Consideration of the operation of the circuit will commence with the deactivated condition in which transistors 30 and 31 are nonconductive so that the relay is deenergized. In this condition the standby current drain is very low. Assuming now that a pulse of light impinges on the photocell 10, the voltage pulse generated by the photovoltaic cell renders the transistor 17 conductive for the duration of the pulse. It will be noted that slowly changing light intensity or ambient light is bypassed by the inductance 22 and does not normally turn on the transistor 17 to any significant amount. A pulse of sufficiently short duration, however, is not immediately bypassed by the inductance and with the transistor 17 rendered conductive a voltage drop appears across the resistor 23 due to the current flowing from the positive conductor through the transistor from emitter 18 to collector 19 and through resistor 23 to the negative terminal. The inductance 22, therefore, may be considered as a discriminating means which allows response only to short duration pulses and does not permit response to slow changes.

Due to the change of potential at collector 19, the voltage charge on capacitor 43 tends to discharge through the transistor and resistor 41, thus tending to make junction 40 positive with respect to positive conductor 11. Thus on the leading edge of the light pulse, as has been described thus far, the voltage induced on transistors 30 and 31 is not in a direction to initiate conduction therein; however, on the decay of the light pulse, whereupon transistor 17 again becomes nonconductive, the capacitor 43 again begins to recharge through the input circuit of transistor 31 and resistor 23. Conduction of the transistor 31 causes a voltage to appear across the relay coil 46, the upper terminal of which is connected to the base electrode 33 thereby tending to turn on transistor 30.

With transistor 30 conductive a further current path may be traced from the emitter 36 to base 35 to collector 34 of transistor 30 and through the transistor 30 to emitter 32 and through resistor 52 to negative terminal 14. A stable conduction is maintained with both transistors 30 and 31 remaining conductive to thereby maintain the relay 46 energized. It is thereby apparent that the decay of the light pulse causes the relay to be energized in which condition it will remain until a subsequent pulse.

To deenergize the activated circuit, the same type of light pulse will initially cause a positive signal to appear at collector 19 when the transistor is rendered conductive and this signal is coupled through the capacitor 43 to the base electrode 35 of transistor 31. This positive pulse is in a direction to tend to turn off the transistor 31 thereby tending to lower the voltage across relay 46 and that of collector 37. Simultaneously the base 33 of transistor 30 is made less conductive, tending to shut off transistor 30. The reduction of conduction in transistor 30 further cuts off the transistor 31 and the action is somewhat regenerative, turning off both of the transistors 30 and 31. The collapsing field of relay coil 46 maintains the base 33 of transistor 30 negative for a period sufficiently long that the decay of the light pulse, which would again tend to bring a slightly negative signal to the base of transistor 31, is overridden and the transistors remain nonconductive.

The sensitivity of the switching circuit to turn-on and turn-off signals can be varied by changing the size of coupling capacitor 43 and of resistor 41. Transistor types may be changed by observing proper circuit energizing polarities.

Many changes and modifications in this invention will undoubtedly become apparent to those who are skilled in the art, and it is therefore my intention to be limited solely by the scope of the appended claims and not by the specific embodiment disclosed herein for the purpose of illustration only.

I claim as my invention:

1. Control apparatus for controlling a relay from a remote source of light pulses comprising:
   means for producing individual brief pulses of light at controlled intervals;
   light responsive signal producing means responsive to said individual pulses of light to produce an output signal for each pulse of light;
   brief pulse discriminating means connected to said light responsive means to eliminate the effects of output signals caused by slowly varying light and to pass signals due to said brief pulses;
   electromechanical relay means characterized in having a relatively slowly collapsing field as compared to the pulse length of said light pulses;
   bistable amplifier means having current carrying electrodes and a control electrode operable to one or the other of two stable conditions, which is rendered conductive from a first of said signals and is rendered nonconductive by the succeeding signal, said amplifier means current carrying electrodes being connected in energizing relation to said relay means;
   circuit means connecting said output signals to said amplifier means control electrode;
   and amplifier means disabling feedback means connecting the potential produced by the collapsing magnetic field of said relay means upon turn-off of the amplifying means to said amplifying means to prevent said amplifying means from being switched on during said period of time in which said relay field is collapsing.

2. Control apparatus for controlling a relay from a remote source of electromagnetic radiation pulses comprising:
   means for producing individual brief pulses of electromagnetic radiation at controlled intervals;
   radiation responsive signal producing means responsive to said individual pulses of radiation to produce an output signal for each pulse;
   brief pulse discriminating means connected to said responsive means to eliminate the effects of output signals caused by slowly varying electromagnetic radiation and to pass signals due to said brief pulses;
   electromechanical relay means characterized in having a relatively slowly collapsing field as compared to the pulse length of said electromagnetic radiation pulses;
   bistable amplifier means, having current carrying electrodes and a control circuit, operable to one or the other of two stable conditions, which means is rendered conductive from a first of said signals and is rendered nonconductive by the succeeding signal, said amplifier means current carrying electrodes being connected in energizing relation to said relay means;
   circuit means connecting said output signals to said amplifier means control electrode;
   and amplifier disabling feedback means connecting the potential produced by the collapsing magnetic field of said relay means upon turn-off of the amplifying means to said amplifying means to temporarily prevent said amplifying means from being switched on during said period of time in which said relay field is collapsing.

3. Control apparatus for controlling a relay from a remote source of light pulses comprising:
   means for producing individual brief pulses of light at controlled intervals;
   light responsive signal producing means responsive to said individual pulses of light to produce an output signal pulse for each pulse of light;
   electromechanical relay means characterized in having a relatively slowly collapsing field as compared to the pulse length of said light pulses;
   and electronic switching means operable to one or the other of two stable conditions comprising a first transistor of one conductivity type having a first collector, a first emitter and a first base, a second transistor of the opposite conductivity type having a second collector, a second emitter and a second base, means directly conencting said first base to said second collector, means connecting said relay means in series with the emitter-collector circuit of said first transistor, feedback means directly connecting said first collector to said second base, means connecting said signal producing means to said first base, said switching means being turned on by the trailing edge of a first of said signal pulses, said switching means being turned off by the leading edge of the succeeding signal pulse, said feedback means being effective to connect the potential produced by the collapsing magnetic field of said relay means upon turn-off of the amplifying means to said second base to prevent said amplifying means from being reswitched on by the trailing edge of said succeeding pulse which occurs during the period of time in which said relay field is collapsing.

References Cited in the file of this patent

UNITED STATES PATENTS

| | | |
|---|---|---|
| 2,533,001 | Eberhard | Dec. 5, 1950 |
| 2,569,345 | Shea | Sept. 25, 1951 |
| 2,665,845 | Trent | Jan. 12, 1954 |
| 2,985,763 | Ress | May 23, 1961 |
| 2,994,784 | White et al. | Aug. 1, 1961 |

OTHER REFERENCES

G. E. Transistor Manual, 4th edition, pp. 123,124 copyright General Electric Co., 1959.